(12) United States Patent
Ebinuma

(10) Patent No.: US 6,252,314 B1
(45) Date of Patent: *Jun. 26, 2001

(54) LINEAR MOTOR AND STAGE SYSTEM, AND SCANNING EXPOSURE APPARATUS USING THE SAME

(75) Inventor: Ryuichi Ebinuma, Tokyo (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/102,814

(22) Filed: Jun. 23, 1998

(30) Foreign Application Priority Data

Jun. 26, 1997 (JP) .................................................. 9-170269

(51) Int. Cl.[7] ............................. H01L 21/00; G03B 27/42
(52) U.S. Cl. .................................. 310/12; 355/53; 355/72
(58) Field of Search ................................. 310/12, 13, 14; 318/135; 356/358, 363, 399, 400, 401; 33/1 M; 74/479.01; 248/913; 355/53, 72

(56) References Cited

U.S. PATENT DOCUMENTS

| 3,376,578 | * | 4/1968 | Sawyer | 310/13 |
|---|---|---|---|---|
| 5,767,948 | | 6/1998 | Loopstra et al. | 355/53 |
| 5,789,892 | * | 8/1998 | Takei | 318/687 |
| 5,841,250 | | 11/1998 | Korenage et al. | 318/135 |
| 5,844,666 | | 12/1998 | Van Engelen et al. | 355/72 |
| 5,850,280 | * | 12/1998 | Ohtomo et al. | 355/53 |
| 5,953,105 | | 9/1999 | Van Engelen et al. | 355/53 |
| 6,084,319 | * | 7/2000 | Kamata et al. | 310/12 |

FOREIGN PATENT DOCUMENTS 0 421 527 * 10/1991 (EP) .

* cited by examiner

Primary Examiner—Nestor Ramirez
Assistant Examiner—Judson H. Jones
(74) Attorney, Agent, or Firm—Fitzpatrick, Cella, Harper & Scinto (57) ABSTRACT

A linear motor includes a stator, a movable element scanningly movable for a predetermined stroke, relative to the stator, and an electromagnetic device for producing a drive force for moving the movable element in a scan direction and in a direction perpendicular to the scan direction. The electromagnetic device includes a coil unit and a magnetic unit. The coil unit has at least two first coils disposed in a predetermined stroke along the scan direction, for producing a force in the scan direction and a second coil disposed in a predetermined stroke for producing a force in a direction perpendicular to the scan direction.

33 Claims, 10 Drawing Sheets

ND STAGE SYSTEM, AND
LINEAR MOTOR AND STAGE SYSTEM, AND SCANNING EXPOSURE APPARATUS USING THE SAME

FIELD OF THE INVENTION AND RELATED ART

This invention relates to a linear motor and a stage system for high precision positioning or scan motion. In another aspect, the invention is concerned with a scanning exposure apparatus using such a stage device. In a further aspect, the invention is directed to a device manufacturing method suitable for the manufacture of microdevices by use of a scanning exposure apparatus described above.

Among exposure apparatuses for use in semiconductor device production, scan type exposure apparatuses become attractive because of their large exposure area. This type of exposure apparatus comprises an exposure optical system for projecting a a semiconductor device pattern formed on a reticle onto a semiconductor substrate coated with a photosensitive material, a reticle stage for scanningly moving the reticle, and a wafer stage for scanningly moving the wafer. These stages perform scan movement. For the scan movement, the positional relation between the stages is controlled precisely to prevent blur or distortion of the image of the reticle pattern as formed on the wafer through the exposure optical system. The stage position is measured by use of a measuring system having a laser interferometer. A stage driving system may comprise an electromagnet type linear motor having good controllability.

Figure 11:
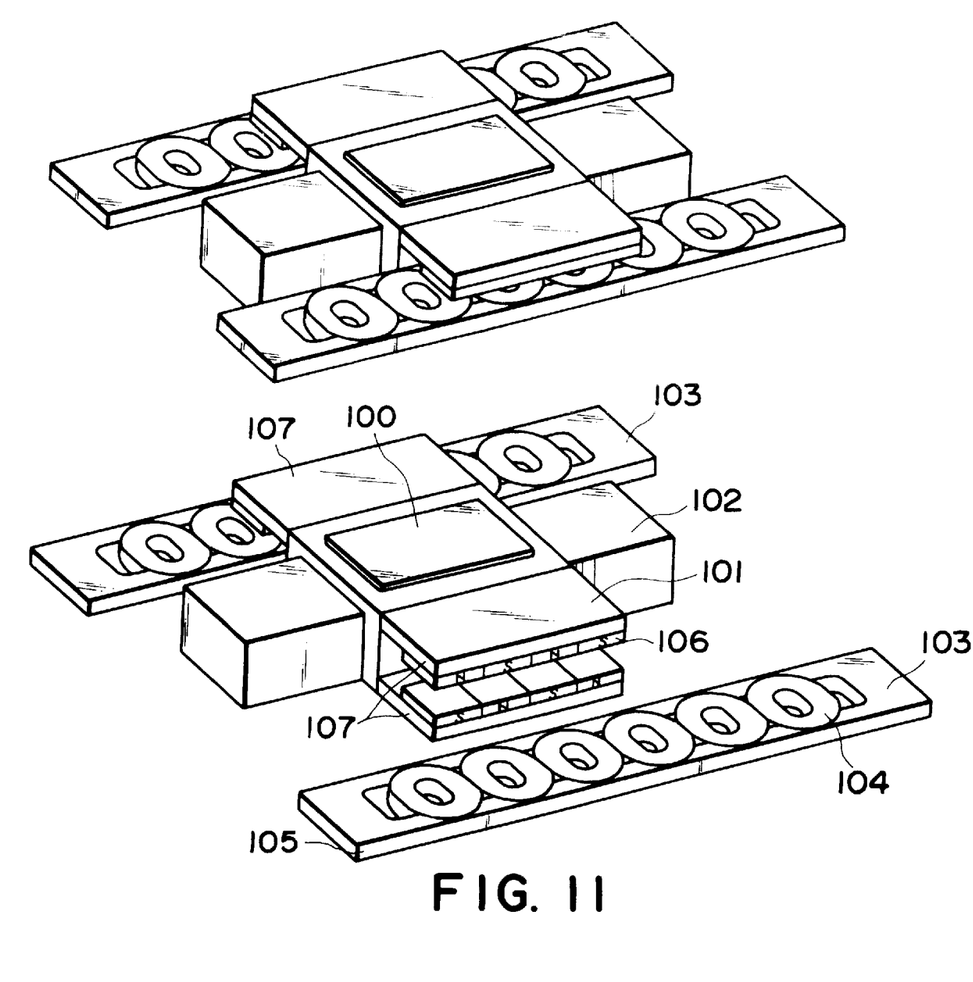
FIG. 11 is a schematic view for explaining an example of a linear motor structure.

FIG. 11 is a schematic view for explaining an example of a stage device having a linear motor. There are movable elements 101 disposed on the opposite sides of a stage movable portion on which a workpiece 100 such as a reticle is placed. They are mounted on a guide 192. Stators 103 are disposed at positions corresponding to the movable elements 101, respectively, while being kept out of contact thereto. Each stator 103 comprises a plurality of coils 104, being stator elements arrayed along the movement direction, and a stator frame 105 for supporting the coils. The movable element 101 comprises a magnet 106 and a yoke 107. In response to a supply of electric current to coils 104, a thrust is produced at the movable element 101. With the movement, coils to be energized by electric current are changed sequentially, whereby the movement stroke is enlarged and a required movement stroke is provided.

In the illustrated stage device, the scan movement is made only in one direction. With respect to directions other than the movement direction, guide means such as an air bearing is used for the confinement.

When a stage device such as shown in FIG. 11 is applied to a reticle stage of a scan type exposure apparatus, the position of a reticle other than in the scan movement direction, or the straightness thereof, is determined by the shape of a guiding surface of guiding means, for example. Namely, since a reticle is confined by the guide means with respect to directions other than the movement direction, the positioning precision with respect to those directions is restricted by the mechanical performance of the guide means.

In scan movement for scanning exposure, it is important to assure registration between motion of a projected image of a reticle pattern and motion of a wafer, within a certain error range. If there is a large misregistration between the motion of the projected image and the motion of wafer, a blurred pattern image will be transferred to the wafer or a generally distorted pattern shape is transferred thereto.

In consideration of the above, during scan movement in an exposure operation, the relative positional relation between a reticle stage and a wafer stage has to be controlled within a predetermined high precision range. How it can be improved is a factor for improving the performance of a scan type exposure apparatus.

SUMMARY OF THE INVENTION

It is an object of the present invention to provide a linear motor or a stage device having good straightness and being suitable for use in a scan type exposure apparatus.

It is another object of the present invention to provide a scan type exposure apparatus having such a stage device, by which enhanced exposure transfer precision is assured.

In accordance with an aspect of the present invention, there is provided a linear motor for scanningly moving a movable element relative to a stator and for a predetermined stroke, wherein the linear motor includes electromagnetic means for producing a drive force for displacing the movable element in a scan direction and also in a direction perpendicular thereto.

The stator may have first coils disposed along the scan direction and one or more second coils disposed separately from the first coils.

The movable element may have first magnet means disposed along the scan direction, and second magnet means disposed along a direction perpendicular to the scan direction.

In accordance with another aspect of the present invention, there is provided a stage system which comprises a linear motor such as described above, for moving a movable stage.

In accordance with a further aspect of the present invention, there is provided a scanning exposure apparatus for projecting a portion of a pattern of a reticle onto a wafer and for scanningly moving the reticle and the wafer, thereby to transfer the reticle pattern onto the wafer, wherein the apparatus comprises a reticle stage for scanningly moving the reticle, having the structure such as described above.

A device manufacturing method for manufacturing devices by use of a scanning exposure apparatus such as described above is within the scope of the present invention.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
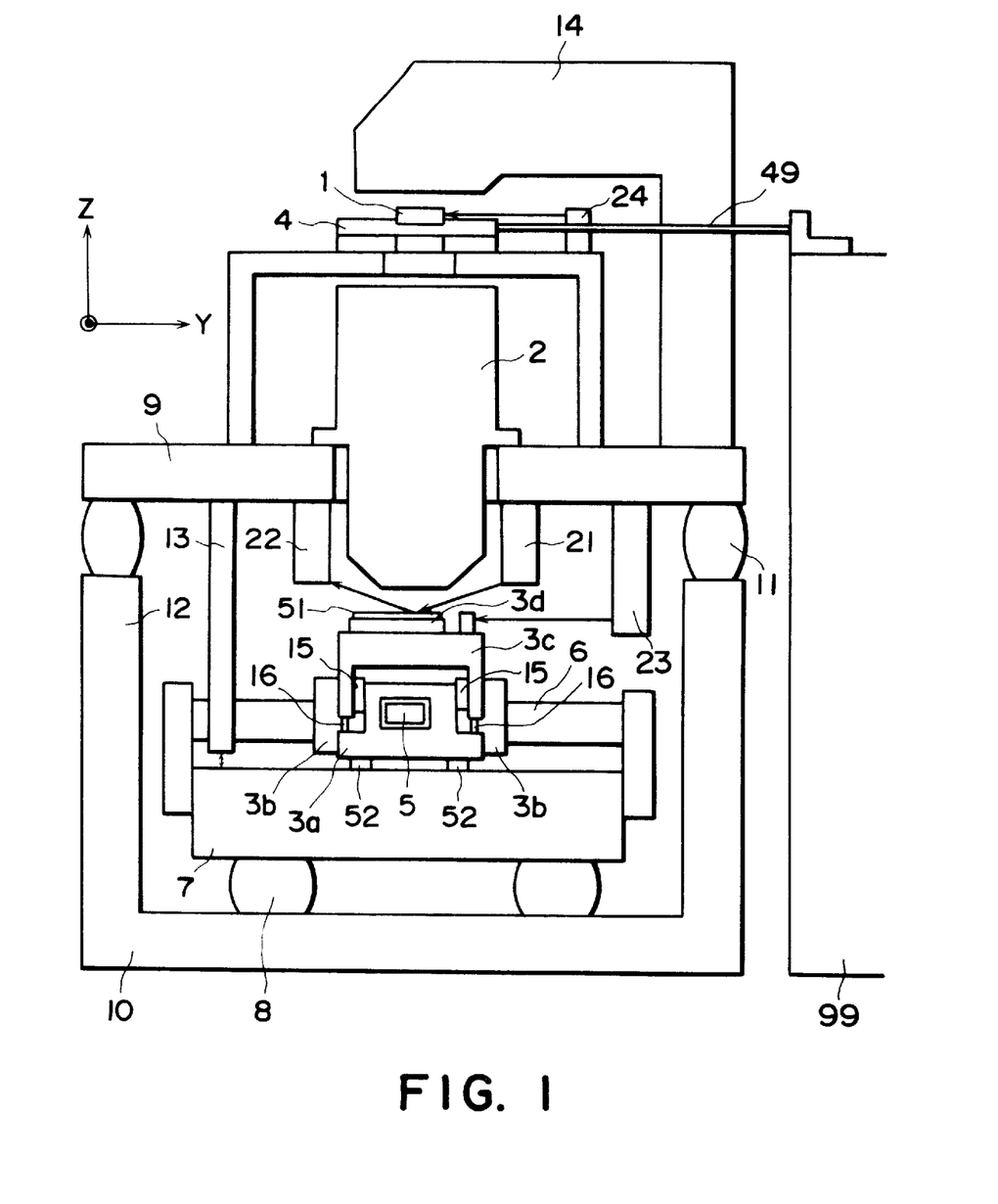
FIG. 1 is a schematic view of a general structure of a scanning exposure apparatus.

Preferred embodiments of the present invention will be described in conjunction with the drawings. FIG. 1 is a side view of a scanning exposure apparatus according to a first embodiment of the present invention, and FIG. 2 is a perspective view of the apparatus.

In this apparatus, a portion of a pattern of a reticle (original) placed on a reticle stage is projected through a projection optical system onto a wafer (substrate to be exposed) placed on a wafer stage, and the reticle and the wafer are scanningly moved in a Y direction relative to the projection optical system, by which the reticle pattern is lithographically transferred to the wafer which is coated with a photosensitive material. Scan exposure is repeated to plural transfer regions (shots) on the wafer, and the wafer stage alternately performs step motion and scan motion. Thus, this type of apparatus is called a step-and-scan type exposure apparatus. Exposure illumination light from an illumination optical system is projected to a portion of the reticle which is placed on the reticle stage. This illumination region has a slit-like shape, and it covers a portion of the pattern region of the reticle. The pattern corresponding to this slit portion is reduced by the projection optical system to a size of ¼, and it is projected in a reduced scale onto the wafer which is placed on the wafer stage.

Figure 2:
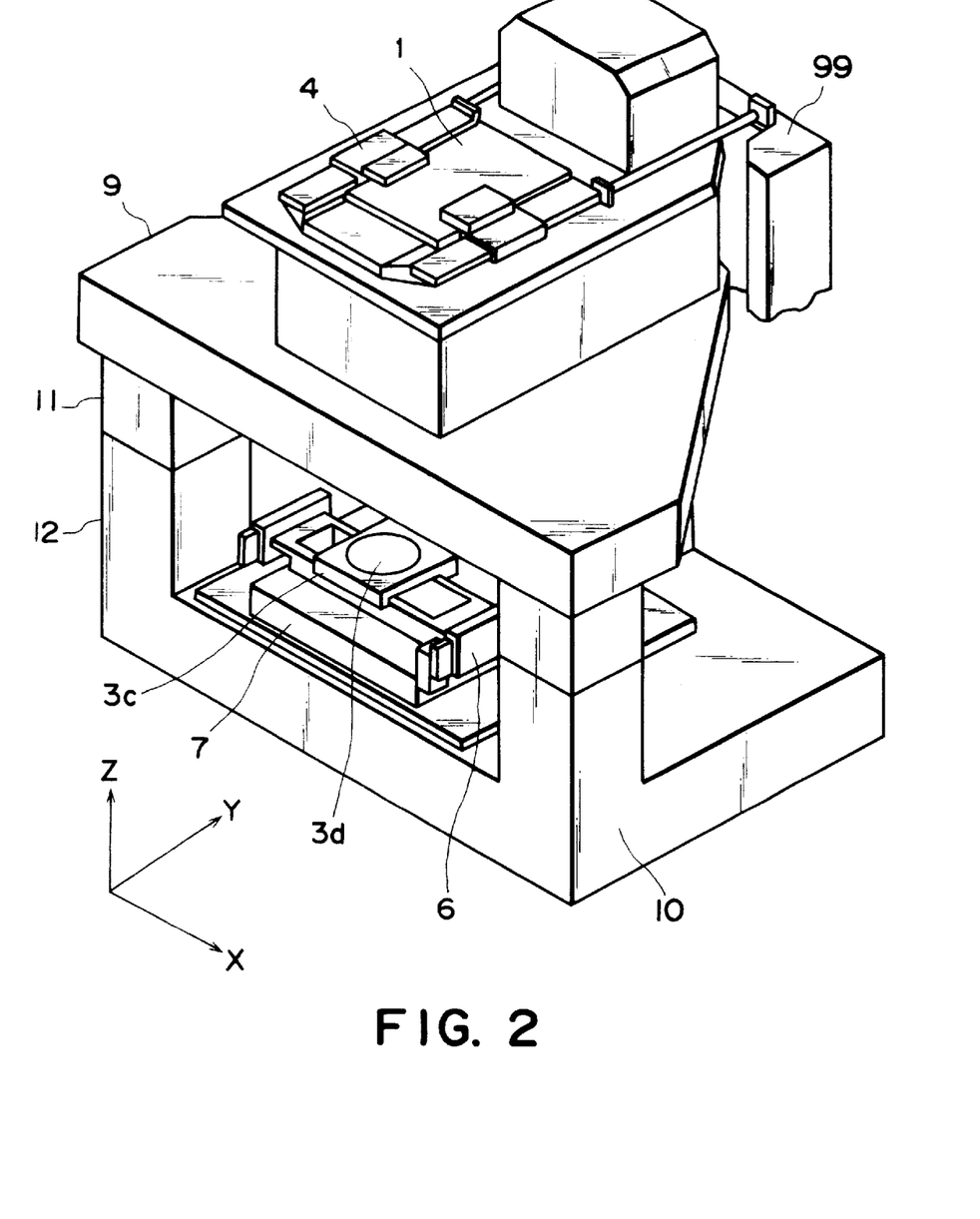
FIG. 2 is a perspective view of the apparatus of FIG. 1.

In FIGS. 1 and 2, the reticle stage 1 can be driven in the Y direction by means of a reticle stage linear motor 4. As will be described later, an important feature of this embodiment of the present invention resides in the structure and function of this linear motor 4. Also, a wafer stage 3 (3a–3d) has a wafer X stage 3a which is driven in an X direction by means of a wafer X stage linear motor 5. Wafer Y stage 3b has the wafer X stage linear motor 5 mounted thereon, and this stage is driven in the Y direction by means of a wafer Y stage linear motor 6.

Motion of the reticle and the wafer during the exposure operation is provided by driving the reticle stage 1 and the wafer Y stage 3b in the Y direction at an approximately constant speed ratio (4:−1, for example, wherein the negative sign represents that the movement direction is inverse). The wafer X stage 3a has a Z tilt stage 3c mounted thereon, and a wafer chuck 3d for holding a wafer 51 is mounted on the Z tilt stage. By means of an air bearing 52, the wafer X stage 3a is guided along the X and Y directions on a stage base table 7, while being confined with respect to the Z direction. The wafer Z tilt stage 3c is driven in a Z tilt direction, relative to the wafer X stage 3a, by means of plural linear motors 15. Sensor 16 between the wafer Z stage 3c and the wafer X stage 3a functions to measure the relative position of them in the Z tilt direction.

The wafer stage 3 is mounted on the stage base table 7, and the stage base table 7 is supported on the bottom surface of a base frame 10 at three points, through three dampers 8. Further, the reticle stage 1, a projection optical system 2 and an illumination system 14 are fixedly mounted on a barrel base 9. The barrel base 9 is supported through three dampers 11 and by three pillars 12 of the base frame 10 which is mounted on the floor. The dampers 8 each comprise an active damper which functions to actively control or isolate vibration with respect to six axis directions. However, a passive damper having such material or structure with a high attenuation characteristic and appropriate elastic modulus may be used.

The stage system further includes various measuring means, such as a laser interferometer 23 which is measuring means for measuring position of the wafer stage, focus detectors 21 and 22 for measuring position and attitude of the wafer with respect to the optical axis direction of the projection optical system, and a laser interferometer 24 which is measuring means for measuring the position of the reticle stage. Additionally, there is a gap sensor 13 for measuring the relative positional relation, in the Z direction, between the barrel base 9, for supporting the reticle stage, and the wafer base 7 for supporting the wafer stage.

Upon acceleration or deceleration of the reticle stage, the stator of the linear motor receives a reaction force of the acceleration or deceleration thrust in the direction opposite to the acceleration or deceleration direction. In order to reduce fluctuation of the barrel base due to this reaction force, there is reticle stage reaction force receiving means 49 by which the motor stator of the reticle stage is coupled to a frame 99 which is supported by the floor, separately from the major assembly of the exposure apparatus. The frame 99 is a mechanical chamber frame of an air conditioning chamber of the exposure apparatus, and it is provided on the floor independently from the barrel base.

Figure 3:
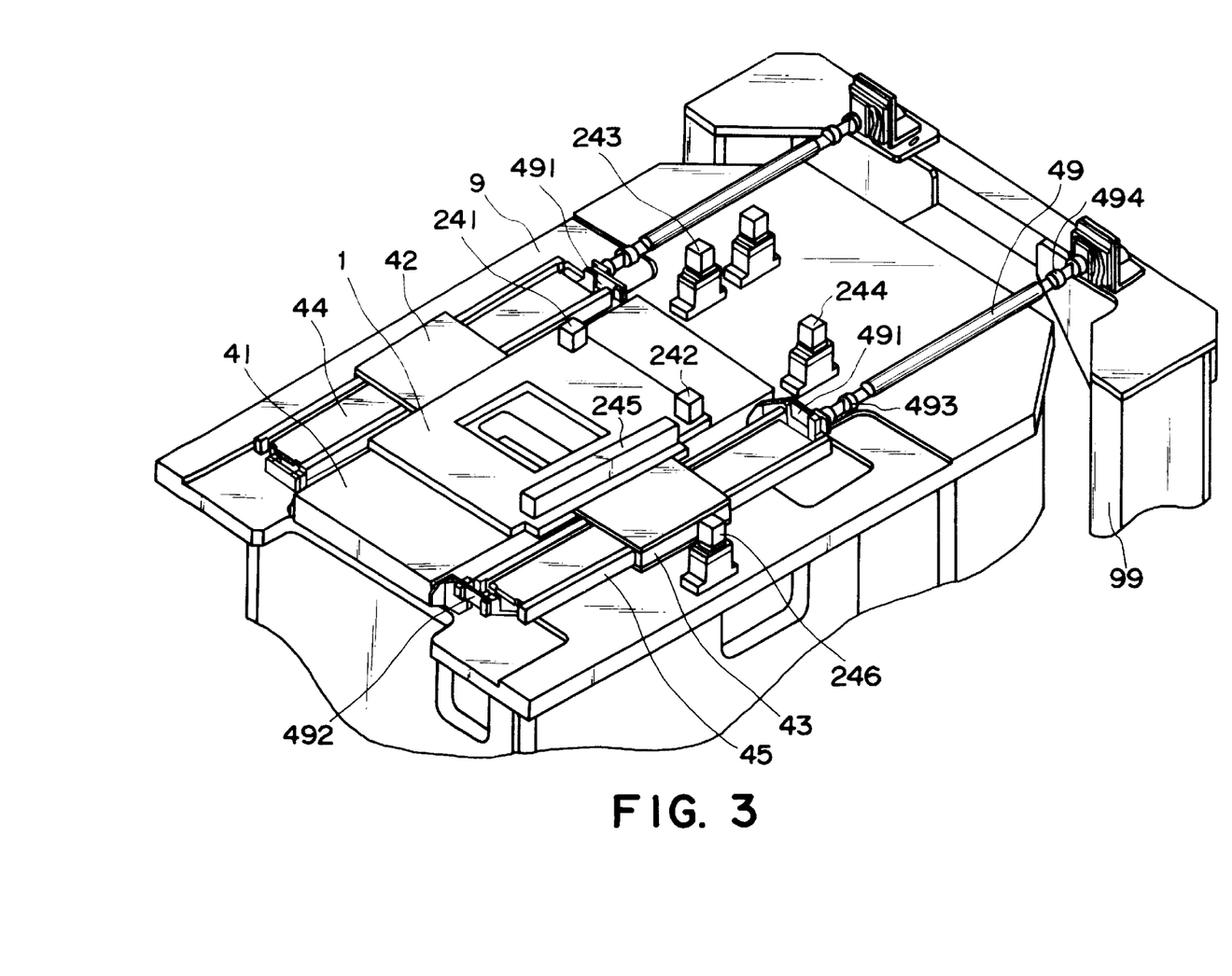
FIG. 3 is a fragmentary view for explaining the structure of a linear motor which is incorporated into a reticle stage.

FIG. 3 shows details of the reticle stage 1 portion. A reticle is placed on a movable stage 1. Denoted at 41 is an air bearing guide having a top surface which provides a guiding surface. Disposed below the movable stage 1 are air bearing pads which serve to support the movable stage 1 on the guiding surface and along the vertical Z direction (optical axis direction of the exposure apparatus projection optical system), for movement along the horizontal X-Y plane (reticle pattern surface direction).

Denoted at 241 and 242 are reflecting members (corner cubes) of measuring means for measuring the position of the movable stage 1, and denoted at 242 and 244 are laser interferometers (which correspond to the laser interferometer 24 of FIG. 1). By means of these two laser interferometers, the position of the movable stage with respect to the scan (Y) direction as well as the attitude (yawing) thereof in a rotational (θ) direction about the exposure optical axis are measured. Denoted at 245 is a mirror (reflecting member) for measuring the position of the movable stage 1 with respect to a direction (X) perpendicular to the scan direction within the plane of the reticle pattern. Denoted at 246 is a laser interferometer associated with this mirror.

Denoted at 42 and 43 are linear motor movable element units which are integrally fixed to the movable stage 1. These units are provided at two locations at the opposite sides of the movable stage 1. These units correspond to the linear motor 4 of FIG. 1. On the other hand, denoted at 44 and 45 are linear motor stator units which are fixed to the frame, for example, of the exposure apparatus. These units are disposed to correspond to the movable element units 42 and 43, respectively. Each of the stator units 44 and 45 is coupled at its opposite end portions, with a low rigidity, to the barrel base 9 through leaf springs 491. These leaf springs 491 serve to reduce transmission, to the barrel base 9, of a reaction force applied to the stator unit due to an acceleration or a deceleration thrust in scanning movement of the movable stage 1. Most of such a reaction force is borne by a frame 99 through a reaction force receiving rod 49. The rod 49 is formed with a cross spring portion 493 and 494 at two positions thereof, and it serves to prevent relative deformation between the barrel base 9 and the frame 99 in any direction other than the reaction force application direction.

Next, the structure and function of the reticle linear motor, which is one important feature of this embodiment, will be described in detail. This linear motor is provided with electromagnetic means for producing a drive force for displacing the movable element in the scan direction and also in a direction perpendicular to the scan direction. With this structure, regardless of anywhere the movable element is positioned within the scan movement range in the Y direction, a driving force in the X direction can be produced to the movable element. Also, to the contrary, regardless of anywhere the movable element is located within the movable range in the X direction, a driving force in the Y direction can be produced to the movable element.

Figure 4:
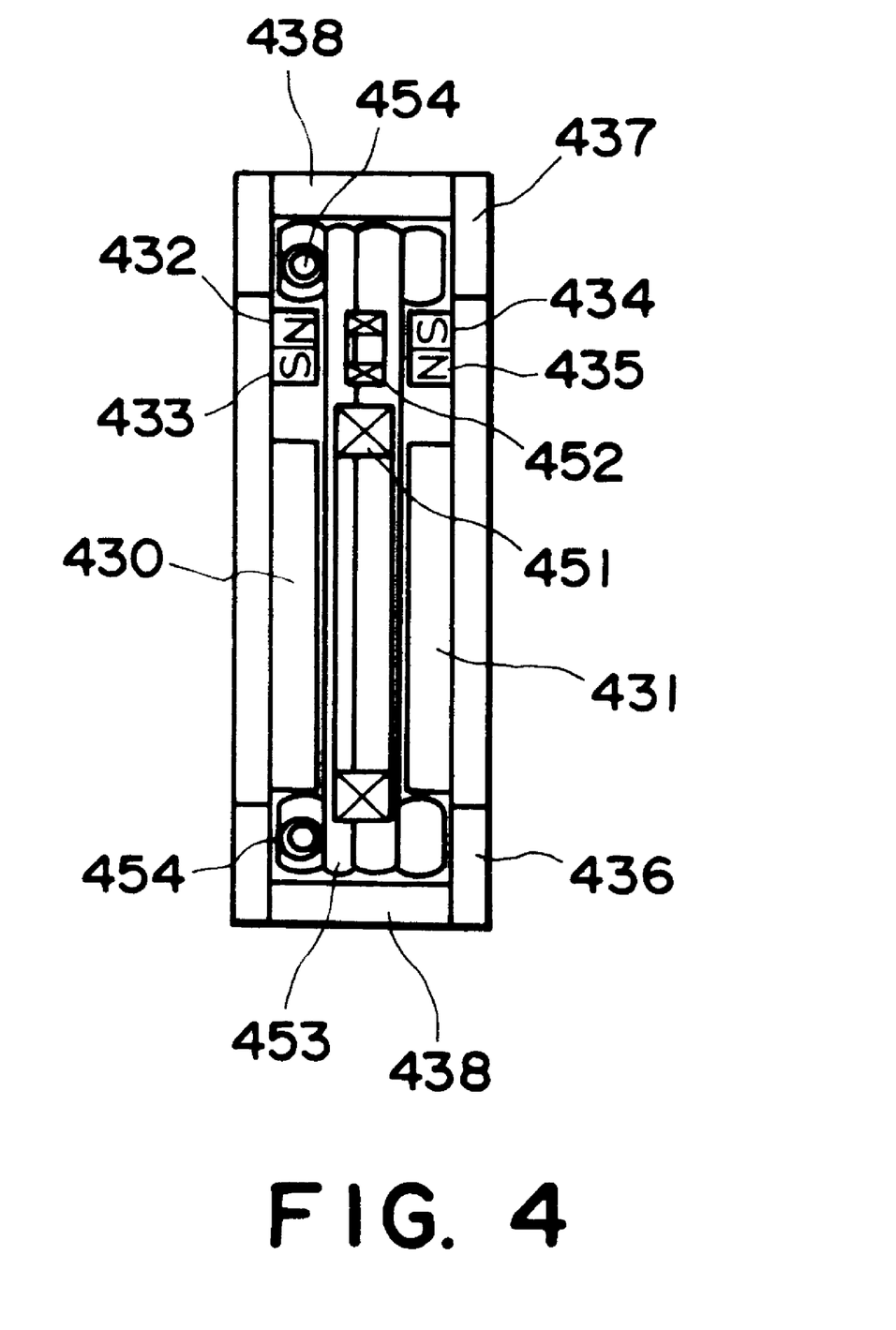
FIG. 4 is a sectional view of a linear motor having a stator and a movable element.
Figure 5:
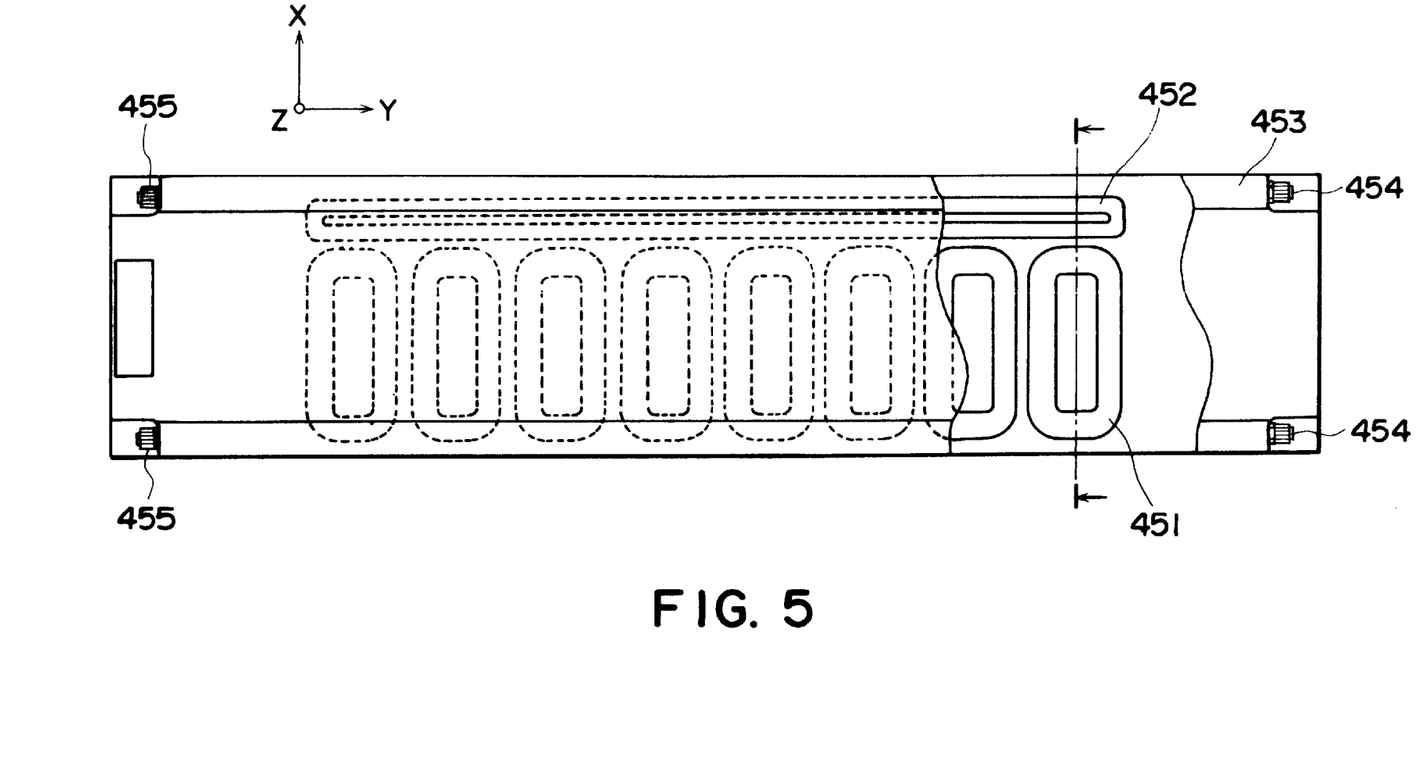
FIG. 5 is a schematic plan view of a stator.
Figure 6:
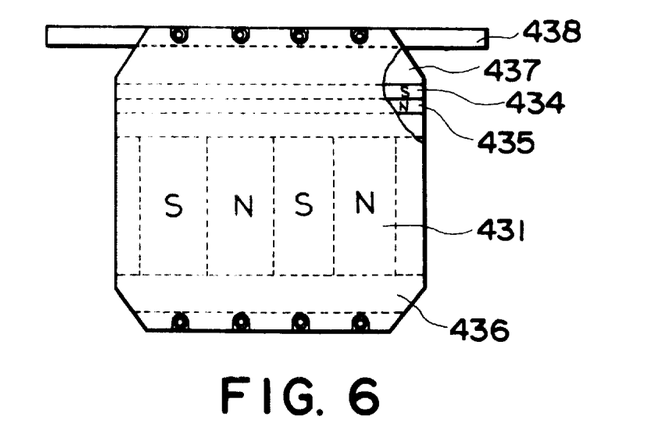
FIG. 6 is a schematic plan view of a movable element.

FIG. 4 is a sectional view of a reticle linear motor having a movable element and a stator. FIG. 5 is a plan view of a stator unit, and FIG. 6 is a plan view of a movable element unit.

As shown in FIGS. 4 and 5, the stator unit comprises plural coils (first coils) 451 disposed along the Y direction, for producing a driving force in a predetermined scan range in the Y direction (scan direction). Additionally, it comprises a single coil (second coil) 452 for producing a driving force within a small range, in the X direction which is perpendicular to the Y direction. The first and second coils are arrayed on the same plane. The number of the second coil is not limited to one, but it is smaller than the number of the first coils.

In FIG. 5, the coil 452 (second coil) has a Y-direction length which is approximately equal to the length of the Y-direction arrayed first coils. The stator having these first and second coils is provided as a single unit. The outside of it is covered by a liquid medium jacket 453. Denoted at 454 is an inlet port for a supply of a liquid medium into the jacket, and denoted at 455 is an outlet port for discharging the liquid medium. By flowing a temperature controlled liquid medium through the liquid medium jacket, temperature rise of the coil can be prevented.

On the other hand, the movable element unit has permanent magnet means and yoke means, for providing a suitable magnetic circuit at positions corresponding to coils of the stator. In FIGS. 4 and 6, denoted at 430 and 431 are permanent magnet arrays (first permanent magnets) for the Y direction (scan direction) which are disposed at the opposite sides of the stator coil 451 to sandwich it. The first permanent magnets include S magnets and N magnets which are arrayed alternately along the Y direction. The magnet arrays 430 and 431 are basically similar to the magnets of the movable element of the FIG. 11 example. Also, magnets 432–435 are permanent magnets (second permanent magnets) for the X direction which is perpendicular to the Y direction. These magnets are disposed at the opposite sides of the second coil 452 of the X stator, to sandwich it. The number of the second permanent magnets is not limited to four.

The X direction and Y direction permanent magnets as well as yokes 436, 437 and 438 of iron material for holding the magnets provide movable element units of a linear motor. Also, the member 438 functions also as a coupling member for connecting the movable element and the movable stage 1.

In the movable element unit having a unit structure described above, a yoke for producing a magnetic circuit of the X direction magnet and a yoke for producing a magnetic circuit of the Y direction magnet are provided by a common member and they are formed into an integral structure. As a result, the structure is very simple and stiff. Since the rigidity of the portion that applies a force to the stage movable portion is enlarged, the stage controllability is good.

Figure 7:
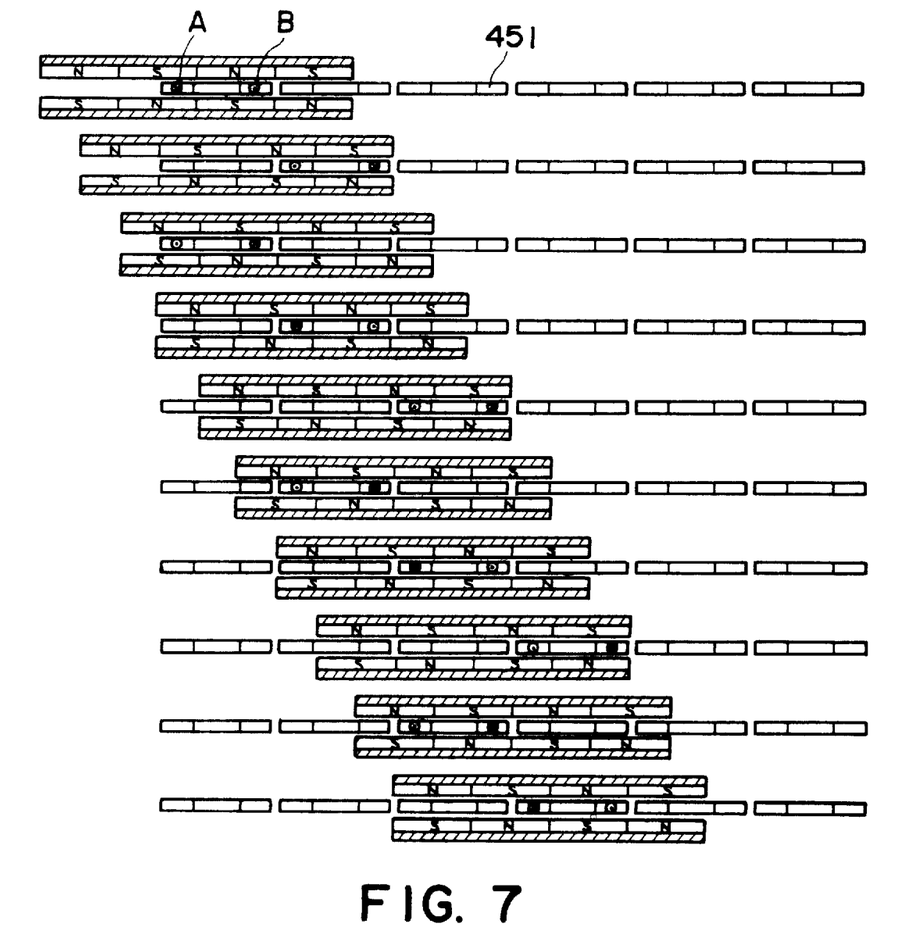
FIG. 7 is a schematic view for explaining the principle of operation of a linear motor.

FIG. 7 is a schematic view for explaining the drive principle of the reticle linear motor, and it shows positions of the movable element being moved with the scan motion, coils to be selected at these positions, and the directions of electric currents flowing into the coils. Reference characters A and B in FIG. 7 denote directions of electric currents, and the directions of electric currents flowing perpendicularly to the sheet of the drawing are opposite to each other. No electric current is supplied to those coils without characters A and B. Coil interchanging is made in accordance with a detection of the position of the stage movable portion in the Y direction. A drive thrust force in the Y direction is produced by sequentially applying electric currents to plural coil arrays of the Y direction stator. The balance of electric currents to be applied to the coils at the opposite sides of the movable portion is controlled on the basis of the measured position of the movable portion in the Y direction and of a measured value of yawing attitude thereof. The electric current to be supplied to the X direction coils is controlled on the basis of a measured value of the X direction position of the stage movable portion.

The reticle linear motor of this embodiment has a sufficient stroke in the Y direction. As regards the X direction, it has a smaller stroke than the Y direction stroke (e.g., not greater than $\frac{1}{10}$). Such a stroke ratio is determined on the basis of the number or size of stator coils in the Y direction or X direction.

When this linear motor is used as a drive source for a reticle stage in a scan type exposure apparatus, the Y direction is placed in registration with the reticle scan direction. Namely, in a scan exposure apparatus, it is necessary to accelerate the reticle up to a predetermined scan speed, and the driving system for the scan direction (Y direction) should have a thrust sufficient for providing quick acceleration. On the other hand, as regards the X direction perpendicular to the scan direction, there is no necessity of acceleration corresponding to the speed of the scan movement. Thus, for the X direction driving system, only a small thrust is necessary, which can meet a force of external disturbance or a force in any direction other than the scan direction, which may be produced during the Y direction acceleration. Further, the required X direction movement stroke is small.

In the reticle stage system of FIG. 3, only one linear motor 45 may have the linear motor structure having been described with reference to FIGS. 4–6 while the other linear motor 44 may have the structure of the FIG. 11 example. Alternatively, both of them may have the linear motor structure of FIGS. 4–6.

When only one linear motor 45 is provided by the linear motor structure of FIGS. 4–6 and the other linear motor is provided by the FIG. 11 structure, a supply of electric currents to the coils 452 may be controlled by use of a measured value of the X direction position of the reticle stage 1, being measured through the interferometer 246. More specifically, an error signal may be produced on the basis of a difference between (i) the X direction position of the reticle stage 1 as measured through the interferometer 246 and (ii) a specified value for the position X and a predetermined correction value being given beforehand in the form of data series or equation expressions as a function of the position Y for correction of an offset value of the interferometer, measuring surface shape or mount attitude of the mirror 245, for example. Such an error signal may be applied to a control system of an electric current driver for controlling electric currents to the coil 452.

When both of the linear motors are provided by the structure having been described above, an error signal as described above may be applied to the control system of the electric current driver for controlling electric currents to the X direction driving coils on the left and right hand sides. In these cases, the stage can be scanningly moved straight, by maintaining the specified value for the position Y constant.

There is another control method for a stage in a scan exposure apparatus. What is required in a scan exposure apparatus is that the positional relation between a reticle stage and a wafer stage is kept in registration within a predetermined high precision range. Since such registration can be done within the range of limitation as required for the scan speed precision, generally a method is adopted in which while scanningly moving these stages both of or one of the stages is displaced minutely to relatively adjust the positional relation of them. In the stage system of the embodiment described above, the structure of the movable portion is rigid and, additionally, the operation point of thrust for the linear motor can be registered with the gravity center of the movable portion. As a result, the control characteristic is good. By using such good controllability, a control signal based on a relative positional difference between the reticle stage position and the wafer stage position may be fed back to the control system for the reticle stage. By this, a scan exposure apparatus of higher exposure precision can be realized.

Figure 8:
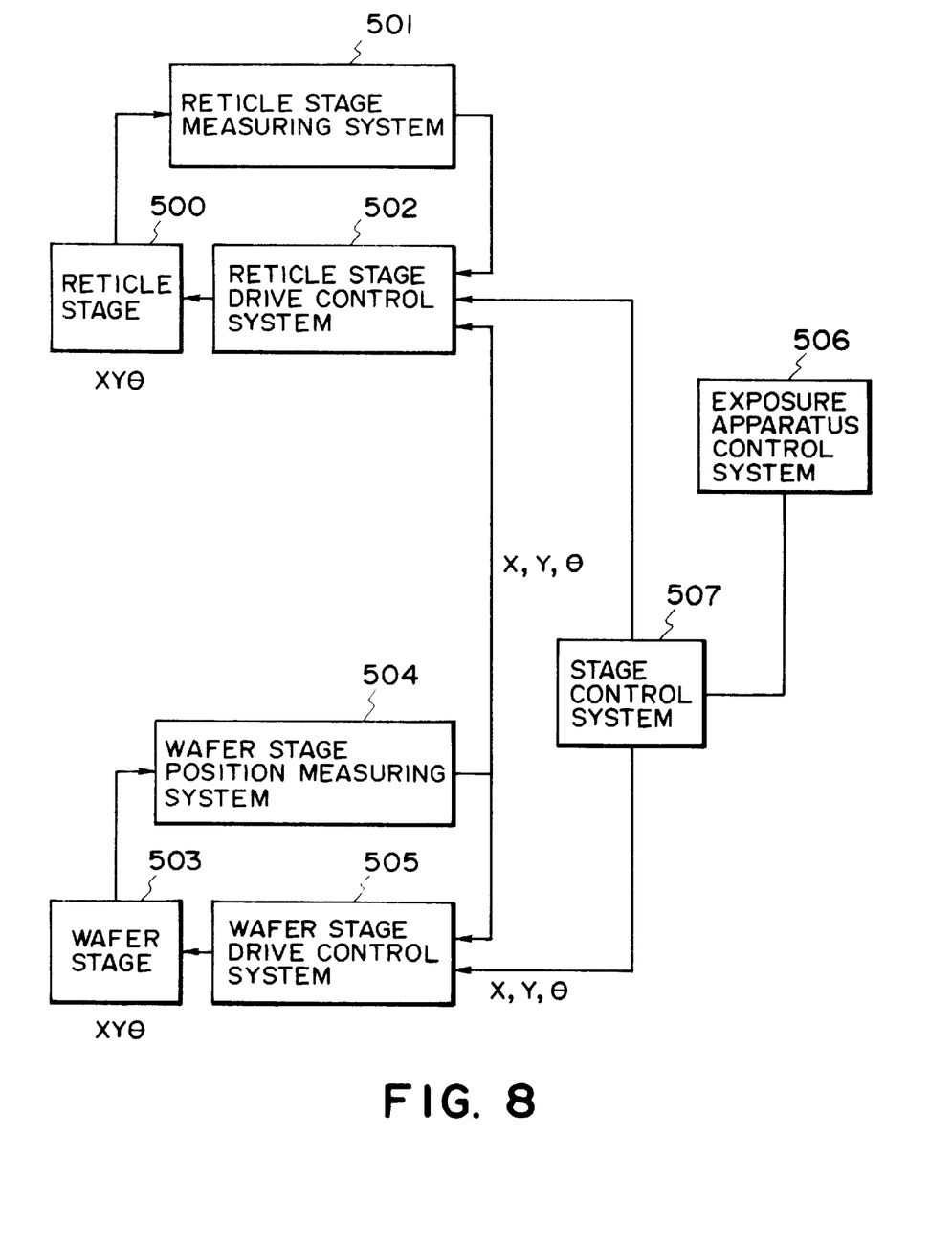
FIG. 8 is a block diagram of a control system in a scanning type exposure apparatus.
Figure 9:
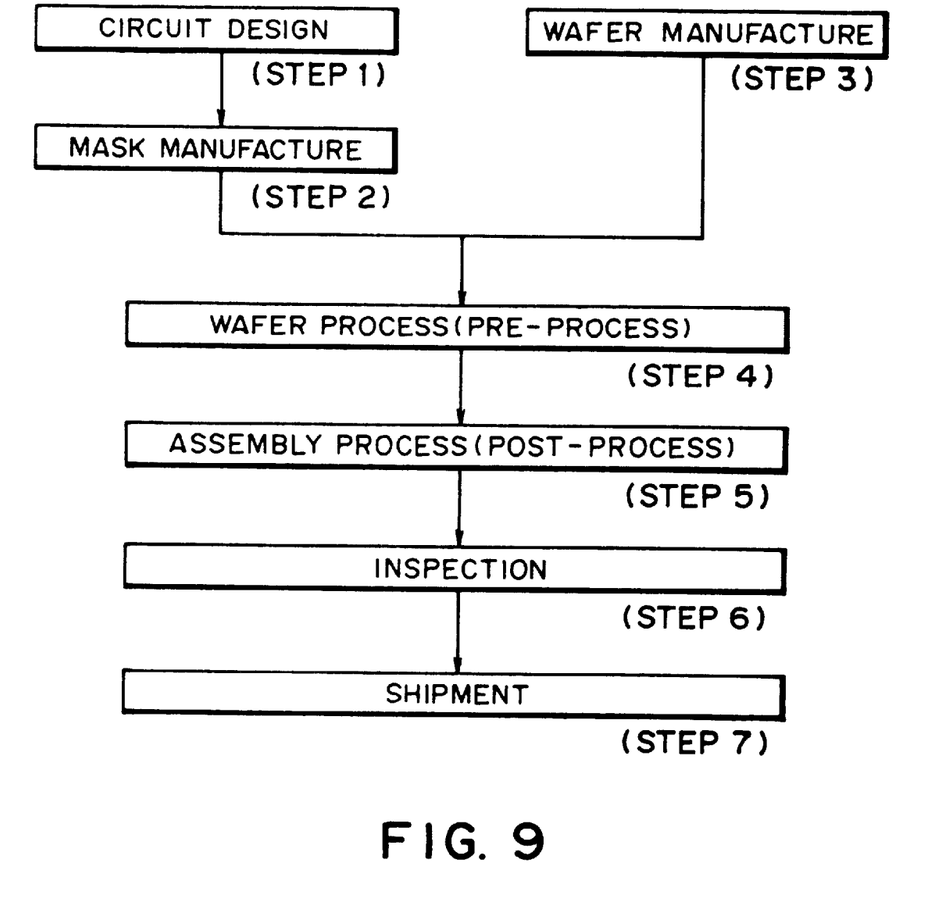
FIG. 9 is a flow chart of semiconductor device manufacturing processes.

FIG. 8 is a block diagram of a control system of a scan exposure apparatus wherein a linear motor as described above is used as a drive source for a reticle stage. In a reticle stage 500 of FIG. 8, positions X and Y as well as position in the θ direction (yawing direction in the scan direction) of the movable portion of the reticle stage, as measured through a reticle stage control system 501, are applied to a reticle stage drive control system 502. On the other hand, in a wafer stage 503, X and Y positions and θ direction position as measured through a wafer stage position measuring system 504 are applied to a wafer stage drive control system 505 and also to the reticle stage drive control system. Further, a signal from an exposure apparatus control system 506 is applied to a stage control system 507, from which a signal is applied to the reticle stage drive control system 502 and the wafer stage drive control system 505.

In this control system, the position of the movable portion of the wafer stage is measured by using the wafer stage measuring system 504, and from the measured value, the position upon the reticle corresponding to the wafer stage movable portion (as being projected by a projection system of 4:−1) is calculated. On the other hand, the position of the reticle stage movable portion is measured by the reticle stage measuring system 501. Then, the amount of relative positional deviation upon the reticle is calculated, and a control amount corresponding to the reticle stage drive force in the direction reducing this deviation is calculated. In accordance with this control signal, the X direction actuator of the reticle stage is driven.

In accordance with a linear motor of this embodiment, as described above, stator means and movable element means are provided to provide motion in the scan direction and also minute motion in a direction perpendicular to the scan direction. Also, the stator means and the movable element means are provided in a unit structure. Thus, a linear motor of simple structure and high rigidity is assured. When such a linear motor is incorporated into a stage system, the stage controllability is good because of improved motor rigidity.

When such a stage system is applied to a reticle stage of a scan type exposure apparatus, a deviation between a reticle stage and a wafer stage in a direction perpendicular to the scan direction can be controlled at the reticle stage side which has a good control response. Thus, high exposure transfer precision is assured.

Next, an embodiment of a device manufacturing method which uses an exposure apparatus such as described above, will be explained.

Figure 10:
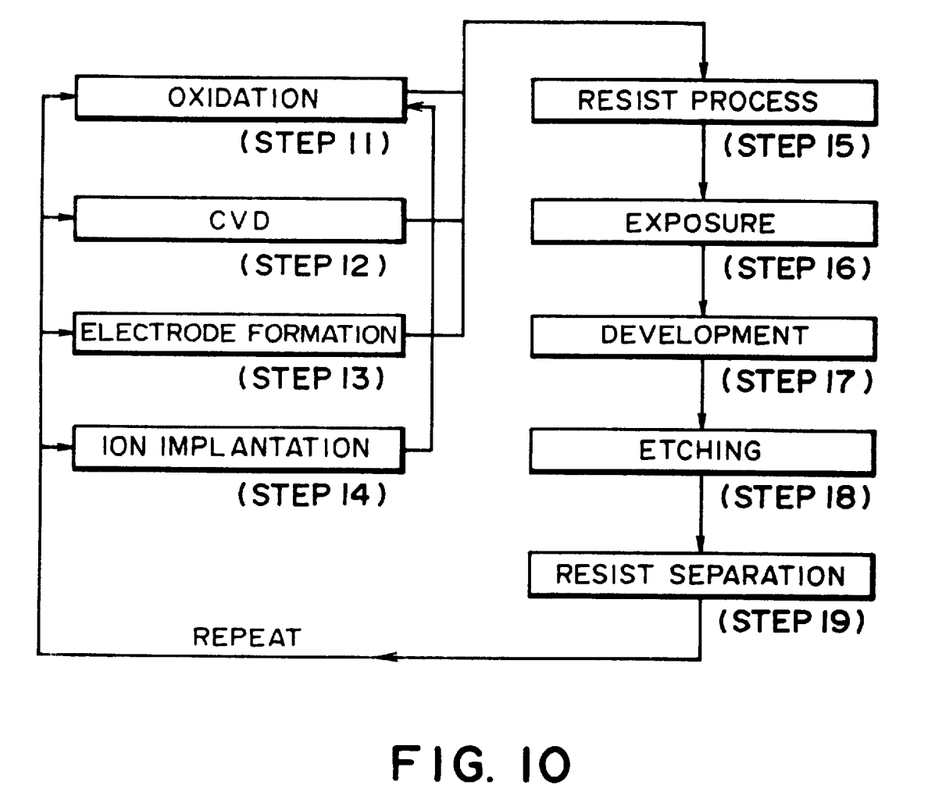
FIG. 10 is a flow chart for explaining details of a wafer process.

FIG. 10 is a flow chart of a procedure for the manufacture of microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

FIG. 11 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. A linear motor, comprising:

a stator;

a movable element scanningly movable for a predetermined stroke, relative to said stator; and electromagnetic means for producing a drive force for moving said movable element in a scan direction and in a direction perpendicular to the scan direction, wherein said electromagnetic means comprises a coil unit and a magnetic unit, said coil unit having at least two first coils used interchangeably and disposed in a predetermined stroke along the scan direction for producing a force in the scan direction, and a second coil disposed in a predetermined stroke for producing a force in a direction perpendicular to the scan direction.

2. A linear motor according to claim 1, wherein said stator has first coils disposed along the scan direction and at least one second coil disposed separately from said first coils.

3. A linear motor according to claim 2, wherein said first coils and said at least one second coil are disposed on the same plane.

4. A linear motor according to claim 1, wherein said stator has a liquid medium jacket.

5. A linear motor according to claim 2, wherein said movable element has at least one first magnet disposed along the scan direction, and at least one second magnet disposed along a direction perpendicular to the scan direction.

6. A stage system, comprising:
   a linear motor including a stator, a movable element scanningly movable for a predetermined stroke, relative to said stator, and electromagnetic means for producing a drive force for moving said movable element in a scan direction and a direction perpendicular to the scan direction, wherein said electromagnetic means comprises a coil unit and a magnetic unit, said coil unit having at least two first coils used interchangeably and disposed in a predetermined stroke along the scan direction for producing a force in the scan direction, and a second coil disposed in a predetermined stroke for producing a force in a direction perpendicular to the scan direction; and
   a movable stage being able to be moved with said linear motor.

7. A stage system, comprising:
   a linear motor including a stator, a movable element scanningly movable for a predetermined stroke, relative to said stator, and electromagnetic means for producing a drive force for moving said movable element in a scan direction and a direction perpendicular to the scan direction, wherein said electromagnetic means comprises a coil unit and a magnetic unit, said coil unit having at least two first coils disposed in a predetermined stroke along the scan direction for producing a force in the scan direction, and a second coil disposed in a predetermined stroke for producing a force in a direction perpendicular to the scan direction;
   a movable stage being able to be moved with said linear motor; and
   plural movable elements which are disposed on opposite sides of said movable stage.

8. A stage system according to claim 6, wherein said movable stage is drive controlled with respect to yawing in the scan direction.

9. A scanning exposure apparatus for projecting a portion of a pattern of a reticle onto a wafer and for scanningly moving the reticle and the wafer, thereby to transfer the reticle pattern onto the wafer, said apparatus comprising:
   a reticle stage for scanningly moving the reticle, wherein said reticle stage includes a linear motor having a stator, a movable element scanningly movable for a predetermined stroke, relative to said stator, electromagnetic means for producing a drive force for moving said movable element in a scan direction and a direction perpendicular to the scan direction, wherein said electromagnetic means comprises a coil unit and a magnetic unit, said coil unit having at least two first coils used interchangeably and disposed in a predetermined stroke along the scan direction for producing a force in the scan direction, and a second coil disposed in a predetermined stroke for producing a force in a direction perpendicular to the scan direction; and
   a movable stage for carrying said reticle stage thereon and being able to be moved with said linear motor.

10. A device manufacturing method, comprising:
   providing a scanning exposure apparatus for projecting a portion of a pattern of a reticle onto a wafer and for scanningly moving the reticle and the wafer, thereby to transfer the reticle pattern onto the wafer, the scanning exposure apparatus including (i) a reticle stage for scanningly moving the reticle, which reticle stage comprises a linear motor having a stator, (ii) a movable element scanningly movable for a predetermined stroke, relative to the stator, (iii) electromagnetic means for producing a drive force for moving the movable element in a scan direction and a direction perpendicular to the scan direction, the electromagnetic means including a coil unit and a magnetic unit, the coil unit having at least two first coils used interchangeably and disposed in a predetermined stroke along the scan direction for producing a force in the scan direction, and a second coil disposed in a predetermined stroke for producing a force in a direction perpendicular to the scan direction, and (iv) a movable stage for carrying the reticle stage thereon and being able to be moved with the linear motor;
   scanningly moving the wafer and the reticle in synchronism with each other and at a predetermined speed ratio; and
   illuminating a portion of the reticle so that during the scan the reticle pattern is transferred to the wafer.

11. A method according to claim 10, further comprising coating the wafer with a resist before exposure, and developing the wafer after the exposure.

12. A linear motor, comprising:
   a stator;
   a movable element movable for a predetermined stroke, wherein the predetermined stroke in a first direction is longer than the predetermined stroke in a second direction; and
   electromagnetic means for producing a drive force for moving said movable element in the first direction and in the second direction, said electromagnetic means comprising a coil unit and a magnetic unit, said coil unit having at least two first coils used interchangeably and disposed in a predetermined stroke along the first direction for producing a force in the first direction, and a second coil disposed in a predetermined stroke for producing a force in the second direction.

13. A linear motor according to claim 12, wherein said stator has a liquid medium jacket.

14. A linear motor according to claim 12, wherein said stator has first coils disposed along the first direction and at least one second coil disposed separately from said first coils.

15. A linear motor according to claim 14, wherein said first coils and said at least one second coil are disposed on the same plane.

16. A linear motor according to claim 14, wherein said movable element has at least one first magnet disposed along the first direction, and at least one second magnet disposed along the second direction.

17. A stage system, comprising:
- a linear motor including a stator, a movable element movable for a predetermined stroke, wherein the predetermined stroke in a first direction is longer than the predetermined stroke in a second direction, and electromagnetic means for producing a drive force for moving said movable element in the first direction and in the second direction, wherein said electromagnetic means comprises a coil unit and a magnetic unit, said coil unit having at least two first coils used interchangeably and disposed in a predetermined stroke along the first direction for producing a force in the first direction, and a second coil disposed in a predetermined stroke for producing a force in the second direction; and
- a movable stage being able to be moved with said linear motor.

18. An exposure apparatus for projecting a portion of a pattern of a reticle onto a wafer and for moving the reticle and the wafer, thereby to transfer the reticle pattern onto the wafer, said apparatus comprising:
- a linear motor having a stator, a movable element movable for a predetermined stroke, wherein the predetermined stroke in a first direction is longer than the predetermined stroke in a second direction, and electromagnetic means for producing a drive force for moving said movable element in the first direction and in the second direction, wherein said electromagnetic means comprises a coil unit and a magnetic unit, said coil unit having at least two first coils used interchangeably and disposed in a predetermined stroke along the first direction for producing a force in the first direction, and a second coil disposed in a predetermined stroke for producing a force in the second direction; and
- a movable stage being able to be moved with said linear motor.

19. A linear motor, comprising:
- a stator;
- a movable element movable for a predetermined stroke;
- electromagnetic means for producing a drive force for moving said movable element in a first direction and in a second direction, wherein said electromagnetic means comprises a coil unit and a magnetic unit, said coil unit having a first coil for producing a force in the first direction and a second coil for producing a force in the second direction; and
- a liquid medium jacket which covers said coil unit, said liquid medium jacket preventing a temperature rise of said first coil and said second coil.

20. A linear motor according to claim 19, wherein the predetermined stroke in the first direction is longer than the predetermined stroke in the second direction.

21. A linear motor according to claim 19, wherein said stator has first coils disposed along the first direction and at least one second coil disposed separately from said first coils.

22. A linear motor according to claim 21, wherein said first coils and said at least one second coil are disposed on the same plane.

23. A linear motor according to claim 21, wherein said movable element has at least one first magnet disposed along the first direction, and at least one second magnet disposed along the second direction.

24. A stage system, comprising:
- a linear motor including a stator, a movable element movable for a predetermined stroke, electromagnetic means for producing a drive force for moving said movable element in a first direction and in a second direction, wherein said electromagnetic means comprises a coil unit and a magnetic unit, said coil unit having a first coil disposed in a predetermined stroke along the first direction, for producing a force in the first direction, a second coil disposed in a predetermined stroke, for producing a force in the second direction, and a liquid medium jacket which covers said coil unit, said liquid medium jacket preventing a temperature rise of said first coil and said second coil; and
- a movable stage being able to be moved with said linear motor.

25. An exposure apparatus for projecting a portion of a pattern of a reticle onto a wafer and for moving the reticle and the wafer, thereby to transfer the reticle pattern onto the wafer, said apparatus comprising:
- a linear motor having a stator, a movable element movable for a predetermined stroke, electromagnetic means for producing a drive force for moving said movable element in a first direction and in a second direction, wherein said electromagnetic means comprises a coil unit and a magnetic unit, said coil unit having a first coil disposed in a predetermined stroke along the first direction, for producing a force in the first direction, and a second coil disposed in a predetermined stroke, for producing a force in the second direction, and a liquid medium jacket which covers said coil unit, said liquid medium jacket preventing a temperature rise of said first coil and said second coil; and
- a movable stage being able to be moved with said linear motor.

26. A linear motor, comprising:
- a stator;
- a movable element movable for a predetermined stroke;
- electromagnetic means for producing a drive force for moving said movable element in a first direction and in a second direction, said electromagnetic means comprising a coil unit and a magnetic unit, said coil unit having at least two first coils disposed in a predetermined stroke along the first direction and being used interchangeably to produce a force in the first direction, and a second coil disposed in a predetermined stroke along the second direction for producing a force in the second direction, said magnetic unit having a first magnet for producing a force in the first direction, a second magnet for producing a force in the second direction and a yoke for producing a magnetic circuit of said first magnet and said second magnet.

27. A linear motor according to claim 26, wherein said stator has a liquid medium jacket.

28. A linear motor according to claim 26, wherein the predetermined stroke in the first direction is longer than the predetermined stroke in the second direction.

29. A linear motor according to claim 28, wherein said movable element has at least one first magnet disposed along the first direction, and at least one second magnet disposed along the second direction.

30. A linear motor according to claim 26, wherein said stator has first coils disposed along the first direction and at least one second coil disposed separately from said first coils.

31. A linear motor according to claim 30, wherein said first coils and said at least one second coil are disposed on the same plane.

32. A stage system, comprising:
- a linear motor including a stator, a movable element movable for a predetermined stroke, and electromagnetic means for producing a drive force for moving said movable element in a first direction and in a second direction, wherein said electromagnetic means comprises a coil unit and a magnetic unit, said coil unit having at least two first coils disposed in a predetermined stroke along the first direction and being used interchangeably to produce a force in the first direction, and a second coil disposed in a predetermined stroke along the second direction for producing a force in the second direction, said magnetic unit having a first magnet for producing a force in the first direction, a second magnet for producing a force in the second direction and a yoke for producing a magnetic circuit of said first magnet and said second magnet; and a movable stage being able to be moved with said linear motor.

33. An exposure apparatus for projecting a portion of a pattern of a reticle onto a wafer and for moving the reticle and the wafer, thereby to transfer the reticle pattern onto the wafer, said apparatus comprising:

a linear motor having a stator, a movable element movable for a predetermined stroke, and electromagnetic means for producing a drive force for moving said movable element in a first direction and in a second direction, wherein said electromagnetic means comprises a coil unit and a magnetic unit, said coil unit having at least two first coils disposed in a predetermined stroke along the first direction and being used interchangeably to produce a force in the first direction, and a second coil disposed in a predetermined stroke along the second direction for producing a force in the second direction, said magnetic unit having a first magnet for producing a force in the first direction, a second magnet for producing a force in the second direction and a yoke for producing a magnetic circuit of said first magnet and said second magnet; and a movable stage being able to be moved with said linear motor.

* * * * *